United States Patent
Guettaf

(10) Patent No.: US 7,500,165 B2
(45) Date of Patent: Mar. 3, 2009

(54) SYSTEMS AND METHODS FOR CONTROLLING CLOCK SIGNALS DURING SCAN TESTING INTEGRATED CIRCUITS

(75) Inventor: Amar Guettaf, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 788 days.

(21) Appl. No.: 10/958,555

(22) Filed: Oct. 6, 2004

(65) Prior Publication Data

US 2006/0075297 A1    Apr. 6, 2006

(51) Int. Cl.
    *G01R 31/28*    (2006.01)
(52) U.S. Cl. ............... 714/731; 714/727; 714/729
(58) Field of Classification Search ............ 714/726, 714/727, 728, 729, 733, 738, 744, 731; 324/765; 327/296
    See application file for complete search history.

(56) References Cited

U.S. PATENT DOCUMENTS

| | | | |
|---|---|---|---|
| 4,493,077 A | | 1/1985 | Agrawal et al. |
| 4,727,545 A | | 2/1988 | Glackemeyer et al. |
| 5,032,783 A | | 7/1991 | Hwang et al. |
| 5,210,486 A | | 5/1993 | Wilson et al. |
| 5,235,600 A | | 8/1993 | Edwards |
| 5,278,842 A | | 1/1994 | Berry et al. |
| 5,341,096 A | * | 8/1994 | Yamamura ............ 324/765 |
| 5,384,533 A | | 1/1995 | Tokuda et al. |
| 5,386,423 A | | 1/1995 | Koo et al. |
| 5,459,736 A | * | 10/1995 | Nakamura ............ 714/731 |
| 5,491,700 A | | 2/1996 | Wright et al. |
| 5,515,384 A | | 5/1996 | Horton |
| 5,541,940 A | | 7/1996 | Akita |
| 5,621,651 A | | 4/1997 | Swoboda |
| 5,663,967 A | | 9/1997 | Lindberg et al. |
| 5,812,562 A | | 9/1998 | Baeg |
| 5,828,579 A | | 10/1998 | Beausang |
| 5,859,442 A | | 1/1999 | Manning |
| 5,905,855 A | | 5/1999 | Klaiber et al. |
| 5,909,451 A | | 6/1999 | Lach et al. |
| 6,106,568 A | | 8/2000 | Beausang et al. |
| 6,199,182 B1 | | 3/2001 | Whetsel |
| 6,260,166 B1 | | 7/2001 | Bhavsar et al. |
| 6,324,678 B1 | | 11/2001 | Dangelo et al. |
| 6,378,093 B1 | | 4/2002 | Whetsel |
| 6,384,660 B1 | * | 5/2002 | Hikima ............ 327/296 |
| 6,452,435 B1 | | 9/2002 | Skergan et al. |
| 6,539,497 B2 | | 3/2003 | Swoboda et al. |
| 6,631,470 B2 | | 10/2003 | Chang et al. |
| 6,646,460 B2 | | 11/2003 | Whetsel |

(Continued)

*Primary Examiner*—David Ton
(74) *Attorney, Agent, or Firm*—Sterne Kessler Goldstein & Fox P.L.L.C.

(57) ABSTRACT

The present invention is directed to systems and method of controlling clock signals during scan testing integrated circuits. The methods and systems provide efficient at-speed scan testing while minimizing the external pins on an integrated circuit dedicated to scan testing clock sources. A clock control circuit is disclosed that includes a scan test control module for permitting a clock signal to be transmitted and a scan test clock decision module for determining whether a clock signal should be permitted to be transmitted. An integrated circuit is disclosed that includes a set of clock control circuits. Embodiments of a scan test control module are provided that can process decoder inputs, ATPG inputs or both. A method is provided that can be used, for example, by an ATPG tool to efficiently provided at-speed scan testing while minimizing external pins dedicated to scan testing clock sources.

14 Claims, 9 Drawing Sheets

U.S. PATENT DOCUMENTS

| | | |
|---|---|---|
| 6,725,432 B2 | 4/2004 | Chang et al. |
| 6,727,723 B2 | 4/2004 | Shimizu et al. |
| 6,760,866 B2 | 7/2004 | Swoboda et al. |
| 6,763,485 B2 | 7/2004 | Whetsel |
| 6,766,501 B1 | 7/2004 | Duggirala et al. |
| 6,861,867 B2 | 3/2005 | West et al. |
| 6,877,123 B2 * | 4/2005 | Johnston et al. ............. 714/731 |
| 6,915,494 B2 | 7/2005 | Shigeta |
| 6,954,887 B2 | 10/2005 | Wang et al. |
| 6,957,403 B2 | 10/2005 | Wang et al. |
| 6,978,416 B2 | 12/2005 | Widmer |
| 6,988,232 B2 | 1/2006 | Ricchetti et al. |
| 6,993,695 B2 | 1/2006 | Rivoir |
| 6,999,386 B2 | 2/2006 | Sugimoto et al. |
| 7,055,172 B2 | 5/2006 | Griswold |
| 7,085,980 B2 | 8/2006 | Martin-de-Nicolas et al. |
| 7,111,209 B2 | 9/2006 | Rajski et al. |
| 7,139,950 B2 | 11/2006 | Huisman et al. |
| 7,139,991 B2 | 11/2006 | Kretchmer |
| 7,158,925 B2 | 1/2007 | Rich et al. |
| 7,181,713 B2 | 2/2007 | Schultz |
| 7,228,464 B2 | 6/2007 | Wilsher |
| 7,239,978 B2 | 7/2007 | Cheng et al. |
| 7,257,796 B2 | 8/2007 | Miller et al. |
| 7,331,032 B2 | 2/2008 | Wang et al. |
| 2003/0101331 A1 | 5/2003 | Boylan et al. |
| 2003/0188214 A1 | 10/2003 | Altmayer et al. |
| 2003/0217341 A1 | 11/2003 | Rajsuman et al. |
| 2004/0098241 A1 | 5/2004 | Guettaf |
| 2004/0123222 A1 | 6/2004 | Widmer |
| 2004/0193983 A1 | 9/2004 | Whetsel |
| 2005/0216805 A1 | 9/2005 | Guettaf |
| 2006/0069972 A1 | 3/2006 | Guettaf |

\* cited by examiner

SYSTEMS AND METHODS FOR CONTROLLING CLOCK SIGNALS DURING SCAN TESTING INTEGRATED CIRCUITS

BACKGROUND OF THE INVENTION

1. Field of the Invention

The present invention relates to integrated circuits, and more particularly, to scan testing of integrated circuits.

2. Background of Invention

Effective testing of integrated circuits significantly enhances the ability of integrated circuit developers and manufacturers to provide reliable devices. Various techniques have been employed to test integrated circuits during the manufacturing process. One such technique that is commonly known, and has been used within the industry for over twenty years is scan testing.

Scan testing provides an efficient approach to testing the structural integrity of devices, such as flip-flops, within a complex integrated circuit. Scan testing does not test integrated circuit-level functionality. Rather, test personnel use scan testing to confirm that individual flip-flops within an integrated circuit function properly. The sheer number of flip-flops within an integrated circuit, which is often greater than a million, presents a daunting challenge for testing. Scan testing addresses this challenge through the use of automated test units that provide test vectors to scan paths including thousands of flip-flops within integrated circuits that have been designed to support scan testing.

Typically, complex integrated circuits are designed and implemented as a series of interconnected functional blocks, each of which can be tested independently. Devices, such as flip-flops, within these functional blocks can be designed, such that they can be connected together in a scan path to support scan testing. Flip-flops and other elements within a scan path include, in addition to inputs and outputs used for normal operation, two inputs associated with the scan testing capability. These include a scan input (SI) and a scan enable (SE) input. Flip-flops within a scan path have their output connected to the SI input of a subsequent flip-flop. The first flip-flop within a scan path receives its input from an automated test unit through a test access port on the chip. The last flip-flop within a scan path provides its output to the automated test unit through a test access port. Many scan paths can exist within a single integrated circuit.

While scan testing provides significant benefits, challenges exist related to how to efficiently debug a scan testing failure to identify the source or sources of the failure. Identifying the source of a scan path failure can be quite difficult. A typical integrated circuit can include many scan paths with each scan path including as many as 10,000 flip-flops. Additionally, when doing scan testing tens of external clock sources can exist. These external clock sources are in turn coupled through multiplexers, logic gates and buffers to form complicated clock trees, such that a single scan path can be effected by multiple clock sources with thousands of clock tree elements.

A wide variety of sources for errors can exist. For example, errors can be caused by process, voltage, and/or temperature variations in which the circuit can function normally at a particularly frequency, temperature or voltage, but when these factors are changed errors can occur. In another example, an incorrect or faulty design, such as using a latch instead of a flip-flop, can cause errors. Yet another example, could be that the mask used to fabricate the integrated circuit was bad leading to broken connections between flip-flops or poorly performing flip-flops. In another case, a wrong wiring diagram can be used by the tester. In this case, a tester might perceive errors, which are not actually errors. Often times the errors are the result of failures in clock trees in which a clock signal is not properly propagated as a result of a bad multiplexer or buffer. Given the large number of scan paths, the large number of flip-flops in a scan path, the interrelationship between scan paths and the many possible sources of errors, debugging scan test failures can take days or even months.

When conducting scan testing, two types of general error results can occur. In the first case, the scan paths under test generates output signals, but the output does not match the expected results. For example, a scan path output may be expected to be 1 0 1 0 1 1 0 1 1 0, but the actual output is 0 0 0 1 1 0 1 1 0 1. These are abbreviated scan path outputs for ease of illustration. Actual outputs will consist of thousands of data points. In the second type of general error, a scan path under test generates no output signal. In this case, there are often multiple scan paths that have failed. This type of failure scenario is often the result of clock or clock tree problems.

Commonly owned, co-pending U.S. patent application Ser. No. 10/806,093, entitled "Methods for Debugging Scan Testing Failures of Integrated Circuits," filed Mar. 23, 2004, provides methods for debugging scan testing failures of integrated circuits. U.S. patent application Ser. No. 10/806,093 ("'093 application") is incorporated herein by reference in its entirety. The '093 application discloses a method that identifies the source of errors when scan paths are producing outputs that are incorrect. The methods dramatically reduce the time needed to debug circuit errors, thereby reducing integrated chip production costs and streamlining integrated circuit manufacturing. The method works well with the first type of errors discussed above. While the method can be used to debug errors in the second case, because the second case usually involves many failed scan paths, the method is not as effective and more efficient approaches are needed.

Commonly owned, co-pending U.S. patent application, entitled "Methods and Computer Program Products for Debugging Clock-Related Scan Testing Failures of Integrated Circuits," ("Debugging Application," application serial number to be determined) filed Sep. 28, 2004 by Amar Guettaf, provides methods for debugging scan testing failures of integrated circuits. The Debugging Application is incorporated herein by reference in its entirety. The Debugging Application discloses a method that identifies the source of errors when scan paths are producing no output. The methods dramatically reduce the time needed to debug circuit errors, thereby reducing integrated chip production costs and streamlining integrated circuit manufacturing. The method works well with the second type of errors discussed above. The combination of the methods provided in the '093 and Debugging applications can significantly reduce scan failure debugging times and increase manufacturing efficiency.

An additional challenge of scan testing is that external pins on an integrated circuit must be reserved to support scan testing. These external pins allow testers to connect integrated circuits to automatic testing tools, such as an Automatic Test Pattern Generation (ATPG) tool to support automated scan testing of an integrated circuit. Chip designers seek to minimize the number of external pins for testing to reduce design cost and allow a greater number of pins for actual use of the integrated circuit.

The number of internal clocks within an integrated chip impacts the number of external pins necessary for scan testing. In a typical chip design, there may be as many as 100 or more clock domains. A clock domain is a group of flip-flops and other logic that use the same clock. Multiple clock domains may impact one another through use of a common gate or flip-flop, providing further difficulties in testing. Independent clock domains are clock domains that are not impacted by each other in any way. The internal clocks that support clock domains often, but not always, have a different operating frequency. Thus, if each clock domain was to have a separate external pin to support testing the number of ports needed would be impractical.

Commonly owned, co-pending U.S. patent application Ser. No. 10/299,257, entitled "System and Method for Clock Domain Group Using Data Path Relationships," filed Nov. 19, 2002 by A. Guettaf, provides methods for reducing the number of external ports needed for clock signals to support scan testing. U.S. patent application Ser. No. 10/299,257 ("'257 application") is incorporated herein by reference in its entirety. The '257 application discloses a method to limit the number of scan test clocks and chip ports used for testing. The method includes identifying clock domains within a chip that are independent of each other (i.e., share no data path between elements within the clock domain) and grouping the independent clock domains together.

Further opportunities to improve the efficiency of scan testing by greater control of clock signals exist. In particular, methods to provide at-speed tests, while also limiting the number of external pins are needed. Conducting at-speed tests provides more robust test results in that the performance of a circuit may not be exactly the same when clock pulses at different speeds that the design speed are used. To reduce the number of pins clocks are used to drive a scan path at a speed different than the design speed with existing methods. Furthermore, in a static design external clock pins are established based on a certain circuit design. During development a circuit design may change resulting in external clock pins that may be used for clock domains that are no longer independent of one another.

What are needed are systems and method for controlling clock signals during scan testing integrated circuits that can support at-speed testing and be adjusted dynamically to address design changes, while minimizing the number of external pins needed to support scan testing clock inputs.

SUMMARY OF THE INVENTION

Systems and method of controlling clock signals during scan testing integrated circuits are disclosed. The methods and systems provide efficient at-speed scan testing while minimizing the number of external pins on an integrated circuit dedicated to scan testing clock sources. A clock control circuit is disclosed that includes a scan test control module for permitting a clock signal to be transmitted; and a scan test clock decision module for determining whether a clock signal should be permitted to be transmitted. Embodiments of a scan test control module are provided that can process decoder inputs, ATPG inputs or both. An integrated circuit is disclosed that includes a set of clock control circuits.

A method is provided that can be used, for example, by an ATPG tool to efficiently provide at-speed scan testing while minimizing the number of external pins dedicated to scan testing clock sources.

Benefits of the invention include, but are not limited to supporting efficient at-speed scan testing while minimizing the external pins on an integrated circuit dedicated to scan testing clock sources.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of utility.

Figure 1:
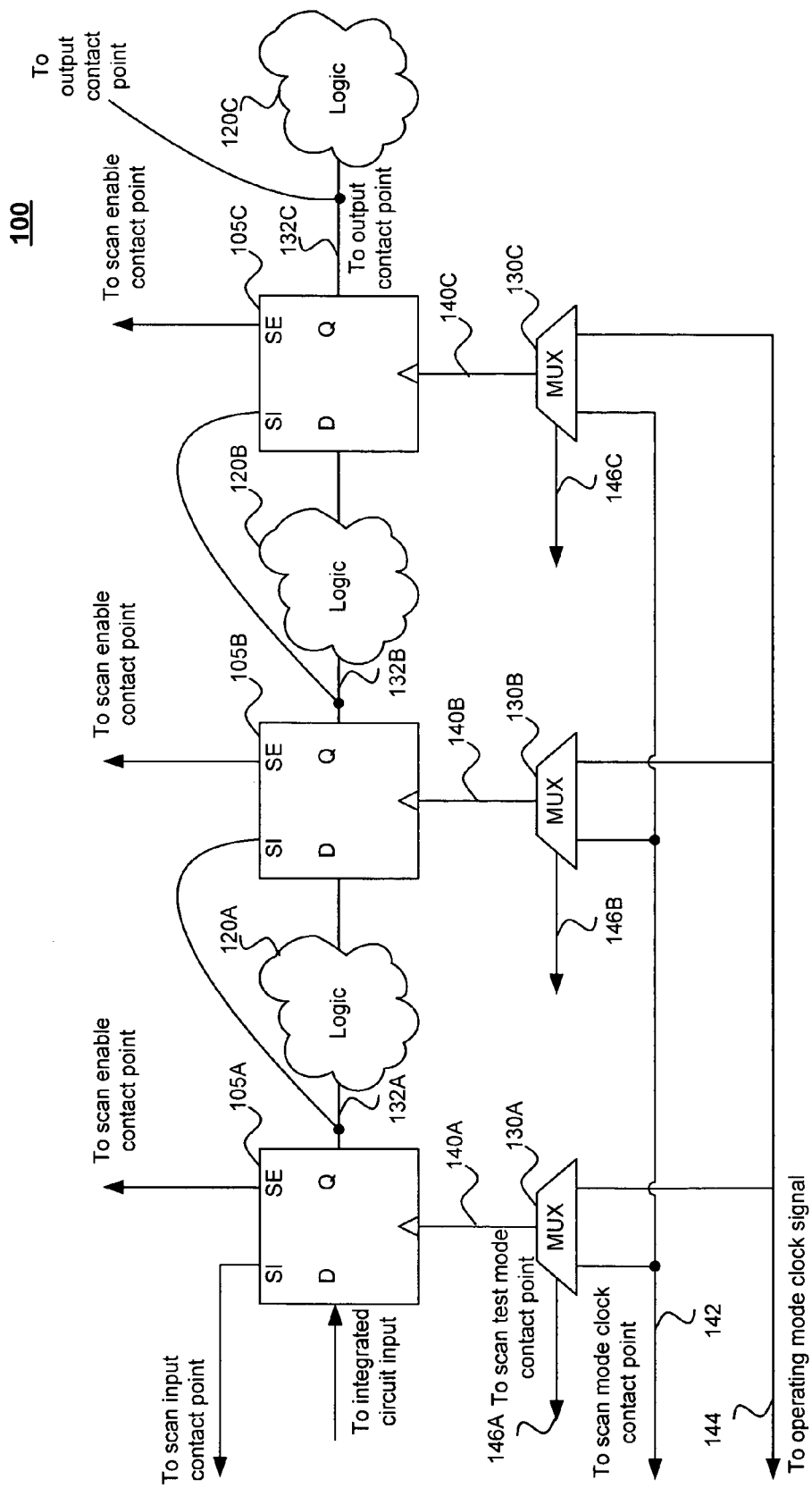
FIG. 1 is a diagram of a truncated scan path.

FIG. 1 illustrates an example of a truncated scan path within an integrated circuit. The scan path includes flip-flop 105A, flip-flop 105B, and flip-flop 105C. Flip-flop 105A represents the first flip-flop in the scan path. An SI input on flip-flop 105A is coupled to a scan input contact point. The scan input contact point provides an interface to an automated testing unit that allows test patterns to be inputted. An SE input on flip-flop 105A is coupled to a scan enable contact point.

Two modes exist within scan testing: shift mode and capture mode. In shift mode, a flip-flop will process inputs received on the SI input. The scan enable contact point provides an interface to an automated testing unit that allows the test unit to provide a signal that places a flip-flop into shift mode. In capture mode, a flip-flop will process inputs received on the D input, as would be the case in normal operating mode. In this case, a low signal is typically applied to the SE input to enter capture mode.

Output 132 of each flip-flop in a scan path is coupled to an SI input of the subsequent flip-flop in a scan path. For example, output 132A of flip-flop 105A is coupled to the SI input of flip-flop 105B. The output 132B of flip-flop 105B is coupled to the SI input of flip-flop 105C. As flip-flop 105C represents the last flip-flop in the scan path, its output 132C is coupled to an output contact point that can be coupled to the automated test unit to enable the test unit to monitor the output patterns during testing. Additionally, outputs 132 from flip-flops 105 are connected to other devices (e.g., logic 120) for normal operation—non-scan test mode—supporting integrated circuit logic and operations.

Clock inputs 140 for each of flip-flops 105 are received from a multiplexer, such as multiplexers 130A, 130B, and 130C. Multiplexers 130 are coupled to clock signal inputs 142 and 144. Clock signal 144 is used for normal operation. Clock signal 142 is used in scan testing mode. In addition, as discussed further below, memory and other functional components contained within logic 120 will receive a clock signal. Each of multiplexers 130A, 130B, and 130C have a control input 146 connected to a scan test mode contact point. When scan testing is to take place, an automated test unit controls multiplexers 130A, 130B, and 130C via control inputs 146 to connect the scan testing mode clock signal 142 to the flip-flop clock inputs 140.

When scan testing takes place, normal operation is suspended and each flip-flop, such as flip-flops 105, within a scan path under test is instructed through the SE input to enter scan test shift mode. For example, a high signal may be placed on this input to enter scan test shift mode. Once the flip-flop, such as flip-flops 105, is in scan test shift mode mode, a test input signal will be inputted from a test vector to the SI input. One or more scan test clock signals, such as clock signal 142, can then be provided to the flip-flops under test to toggle the flip-flops and to clock out a scan test output.

Figure 2:
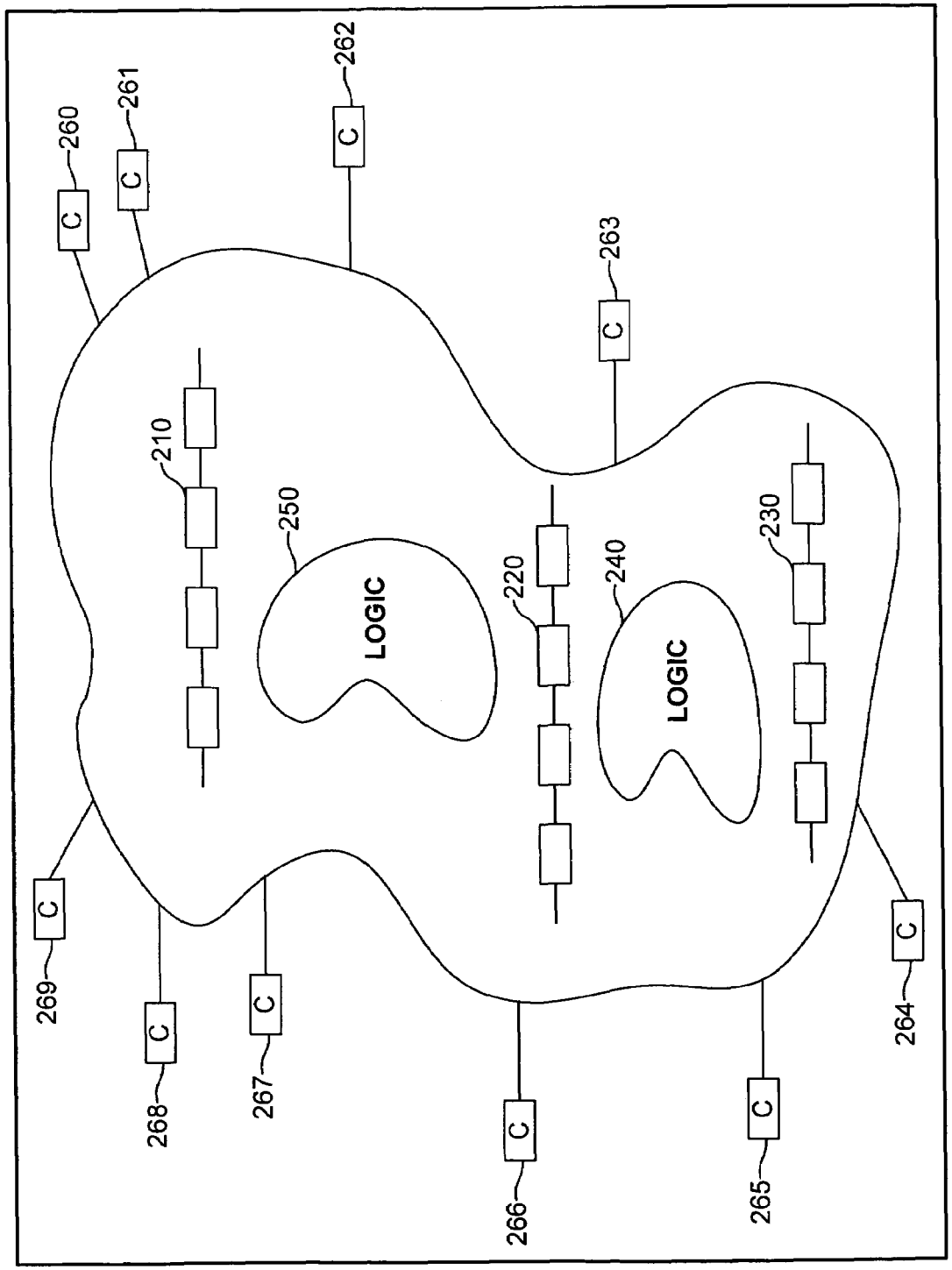
FIG. 2 is a diagram of an integrated circuit.

FIG. 2 is a diagram of integrated circuit 200. Integrated circuit 200 includes scan paths 210, 220 and 230. Additionally, integrated circuit contains logic 240 and 250. Logic 240 and 250 can include memory cells and other logic devices. Timing signals are provided to integrated circuit 200 by clock sources 260, 261, 262, 263, 264, 265, 266, 267, 268, and 269. Integrated circuit 200 is a simplified example of an integrated circuit for the ease of illustration. Typical integrated circuits can have tens of clock sources with hundreds of scan paths that have upwards of 10,000 flip-flops each.

When conducting scan testing one or more of the internal clock sources needs to be bypassed, and an external clock source used to provide timing signals in a controlled manner. The internal clock sources will be coupled to a series of gates, buffers and multiplexers to form a clock tree that connects to the flip-flops that are to be tested. The internal clock sources typically will operate at a variety of frequencies and can be formed into independent clock domains, as discussed above.

Figure 3:
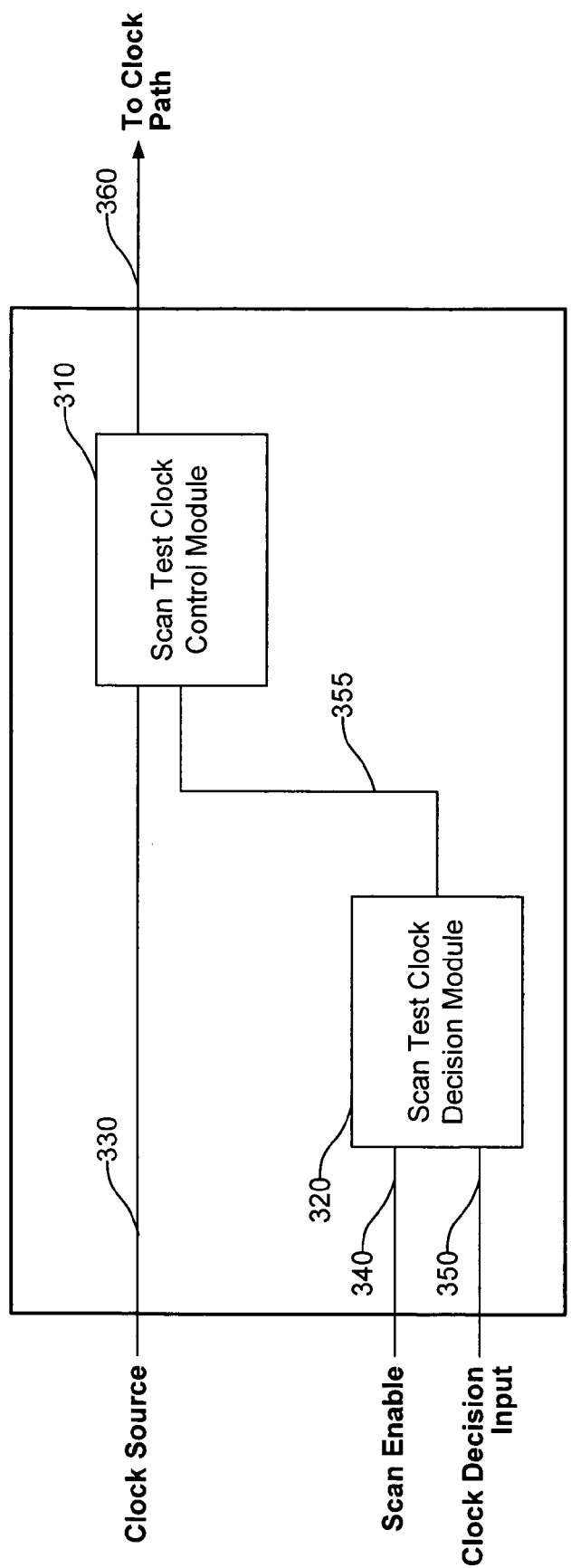
FIG. 3 is a diagram of a clock control circuit, according to an embodiment of the invention.

FIG. 3 is a diagram of clock control circuit 300, according to an embodiment of the invention. Clock control circuit 300 includes scan test clock control module 310 and scan test clock decision module 320. Scan test clock control module 310 permits a clock signal to be transmitted. Scan test clock decision module 320 determines whether a clock signal should be permitted to be transmitted. The output of scan test clock decision module 320 is coupled to an input of scan test clock control module 310. Scan test clock control module 310 uses the output from scan test clock decision module 320 to determine whether to permit a clock signal to be transmitted.

For example, in FIG. 3 external clock source 330 used to support testing is provided as an input to scan test clock control module 310. When scan test clock control module 310 receives an indication from scan test clock decision module 320 to transmit the clock signal, the clock source 330 signal will be permitted to be transmitted, otherwise scan test clock control module 310 will prevent the clock source 330 signal from being transmitted.

Scan test clock decision module 320 has two inputs: scan enable input 340 and clock decision input 350. Scan enable input 340 is used to provide a control input for determining whether to transmit a clock signal during scan testing shift mode. Clock decision input 350 is used to provide a control input for determining whether to transmit a clock signal during scan testing capture mode. Clock control circuit 300 provides output 360, which is coupled to a clock path, as described below with reference to FIG. 5.

In an example embodiment when either scan enable 340 or clock decision input 350 are high, scan test clock decision module 320 will output a high signal as clock decision output 355. When clock decision output 355 is high, scan test clock control module 310 will permit clock source 330 to be transmitted to a clock path, such as clock path 142 in FIG. 1.

Figure 4A:
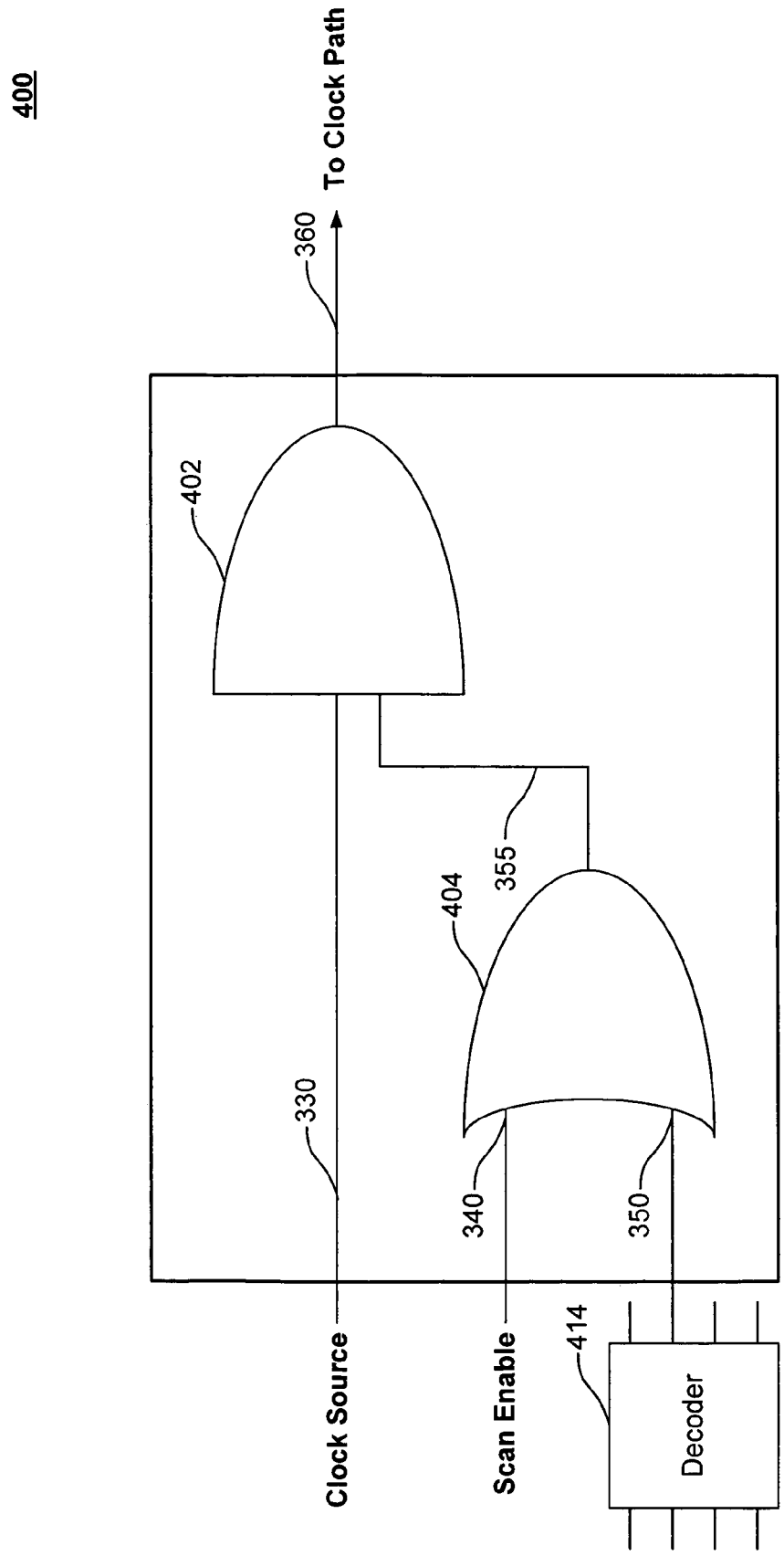
FIG. 4A is a diagram of another clock control circuit, according to an embodiment of the invention.

FIG. 4A is a diagram of clock control circuit 400, according to an embodiment of the invention. Clock control circuit 400 provides an example implementation of clock control circuit 300 in which AND gate 402 is used as scan test clock control module 310 and OR gate 404 is used as scan test clock decision module 320. Additionally, FIG. 4A shows the use of decoder 414. Decoder 414 is used to generate clock decision input 350. That is, decoder 414 provides outputs that determine at what time a clock signal should be allowed to be transmitted for a particular clock domain.

In this example implementation, scan enable input 340 and clock decision input 350 are input to OR gate 404. The output of OR gate 404 is coupled to an input of AND gate 402. AND gate 402 receives as its other input, clock source signal 330. The output of AND gate 402 is provided to clock path 360 for use by a particular clock path within an integrated circuit.

When either scan enable 340 or clock decision input 350 are high, OR gate 404 will output a high signal as clock decision output 355. When clock decision output 360 is high, AND gate 402 will permit clock source 330 to be transmitted to a clock path, such as clock path 142 in FIG. 1.

Figure 4B:
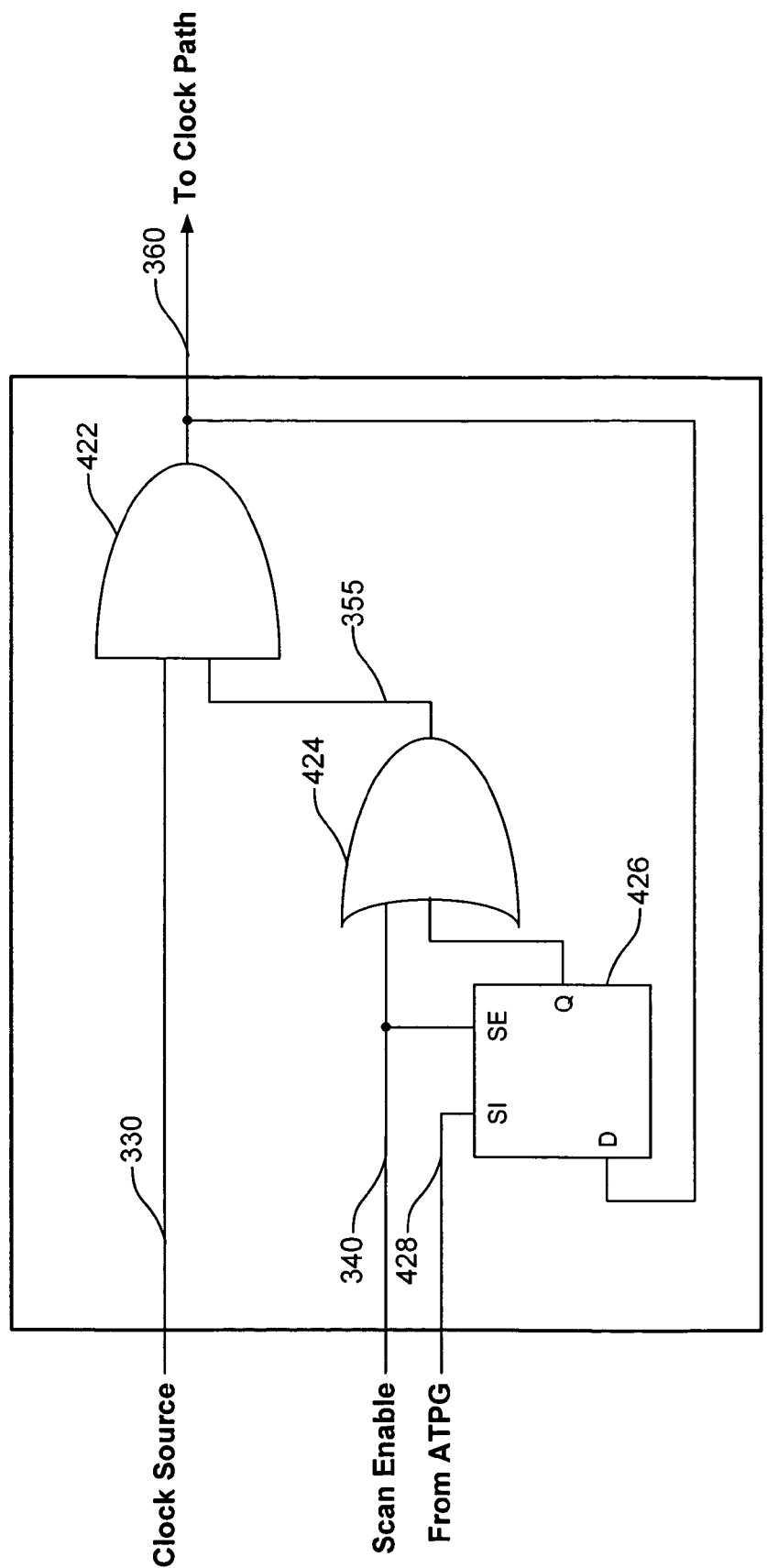
FIG. 4B is a diagram of another clock control circuit, according to an embodiment of the invention.

FIG. 4B is a diagram of clock control circuit 420, according to an embodiment of the invention. Clock control circuit 420 provides another example implementation of clock control circuit 300 in which AND gate 422 is used as scan test clock control module 310 and the combination of OR gate 424 and flip-flop 426 is used as scan test clock decision module 320.

In this example implementation, the SI input of flip-flop 426 is coupled to an ATPG testing tool. The ATPG testing tool can be programmed to provide a test pattern such that an appropriate signal can be provided as clock decision input 428 to cause flip-flop 426 to output a signal that would lead to clock pulses being transmitted when desired. The SE input of flip-flop 426 is coupled to scan enable input 340. The D input of flip-flop 426 is coupled to the output of AND gate 422.

The Q output of flip-flop 426 and scan enable input 340 are input to OR gate 424. The output of OR gate 424 is coupled to an input of AND gate 422. AND gate 422 receives as its other input, clock source signal 330. The output of AND gate 422 is provided to clock path 360 for use by a particular clock path within an integrated circuit.

Figure 4C:
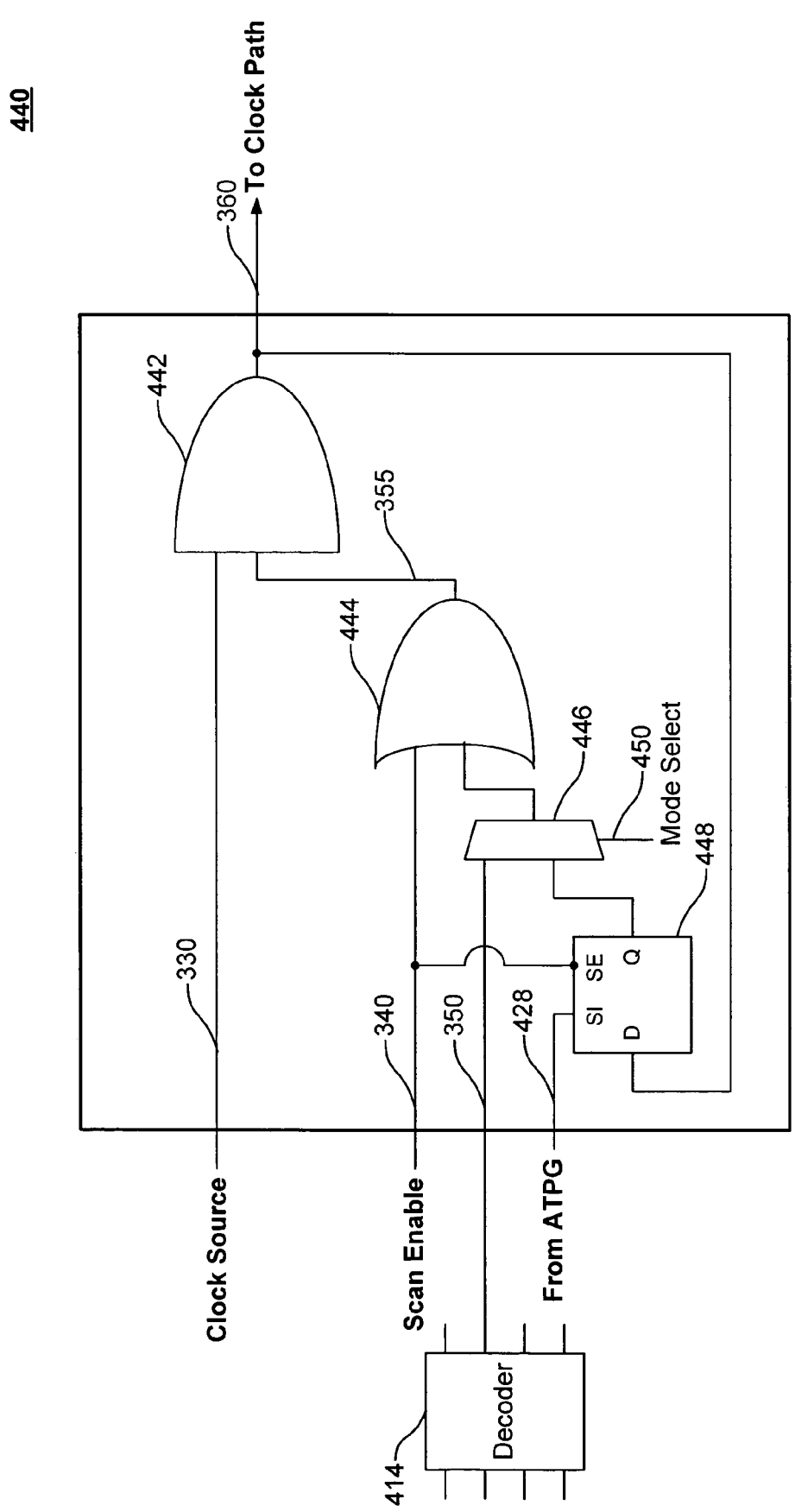
FIG. 4C is a diagram of another clock control circuit, according to an embodiment of the invention.

FIG. 4C is a diagram of clock control circuit 440, according to an embodiment of the invention. Clock control circuit 440 provides another example implementation of clock control circuit 300. Clock control circuit 440 represents a hybrid circuit of clock control circuit 400 and 420. Clock control circuit 440 includes AND gate 442, OR gate 444, multiplexer 446 and flip-flop 448. In this example, AND gate 442 is used as scan test clock control module 310 and the combination of OR gate 444, multiplexer 446 and flip-flop 448 is used as scan test clock decision module 320.

In this example implementation, multiplexer 446 is used to determine which operating mode clock control circuit 440 will use. Clock control circuit 440 can operate in a decoder-based mode similar to that of clock control circuit 400 or in at ATPG-based mode similar to that of clock control circuit 420. Multiplexer 446 includes mode select input 450. The mode of operation is determined by the signal provided as mode select input 450. An external source provides the mode select input.

The SI input of flip-flop 448 is coupled to an ATPG testing tool. The ATPG testing tool can be programmed to provide a test pattern such that an appropriate signal can be provided as clock decision input 428 to cause flip-flop 448 to output a signal that would lead to clock pulses being transmitted when desired. The SE input of flip-flop 448 is coupled to scan enable input 340. The D input of flip-flop 448 is coupled to the output of AND gate 442.

The Q output of flip-flop 448 and clock decision input 350 are input to multiplexer 446. Clock decision input 350 is provided by decoder 414 in a manner similar to that discussed with reference to clock control circuit 400. The output of multiplexer 446 is provided to OR gate 444 as one of OR gate 444's inputs. Multiplexer 446 will pass clock decision input 350 when in decoder mode and will pass the output of flip-flop 448 when in ATPG mode based on mode select input 450. The other input of OR gate 444 is coupled to scan enable input 340.

The output of OR gate 444 is coupled to an input of AND gate 442. AND gate 442 receives as its other input clock source signal 330. The output of AND gate 442 is provided to clock path 360 for use by a particular clock path within an integrated circuit.

Clock control circuits 400, 420 and 440 provide example implementations of clock control circuit 300 that can be coupled, for example, to clock path 142 in FIG. 1. These examples are not intended to limit the scope of the invention. Individuals skilled in the relevant arts will be able to determine other clock control circuits based on the teachings herein.

Figure 5:
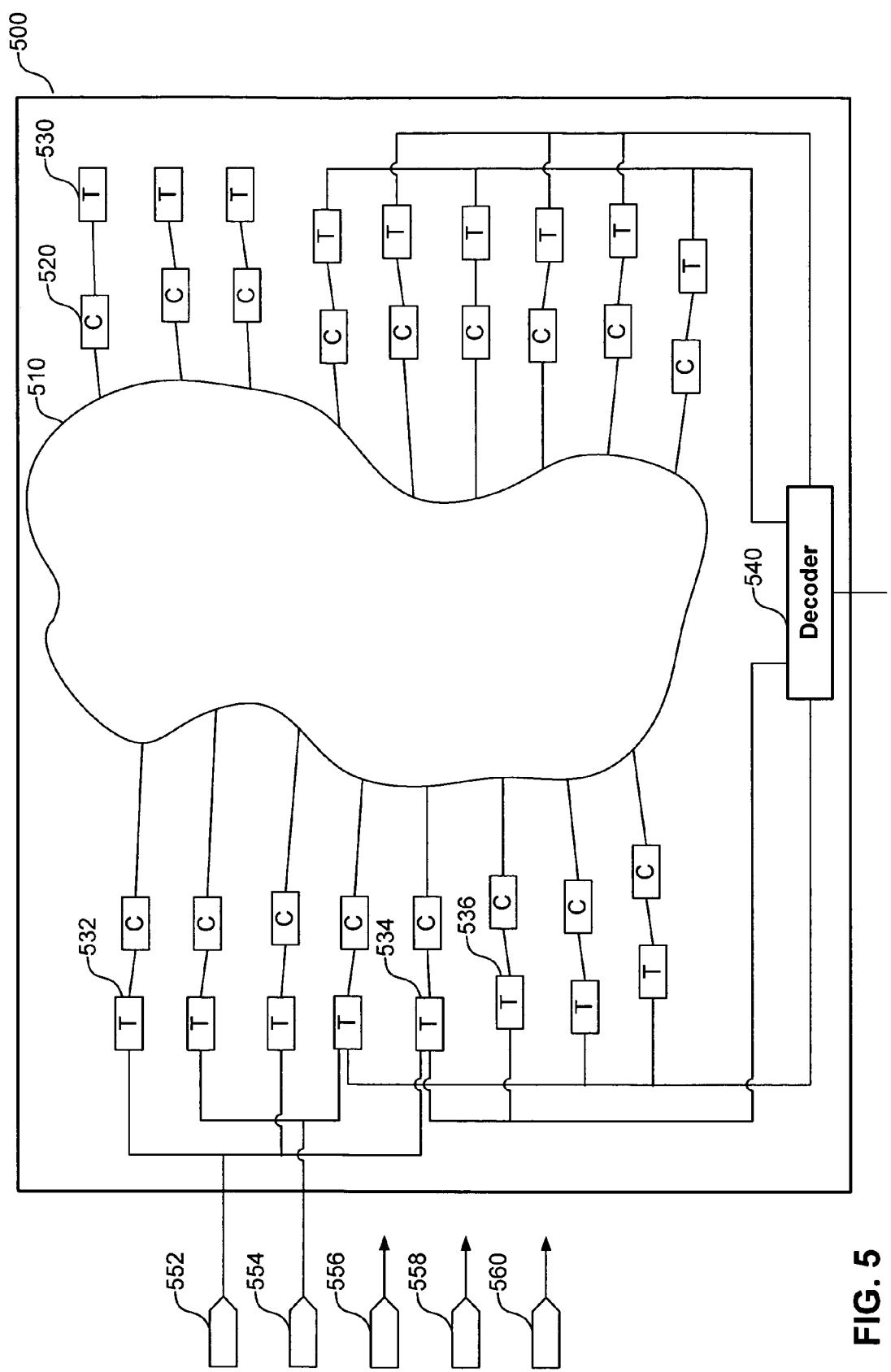
FIG. 5 is a diagram of an integrated circuit with a set of clock control circuits, according to an embodiment of the invention.

FIG. 5 is a diagram of integrated circuit 500, according to an embodiment of the invention. Integrated circuit 500 includes a set of flip-flops and logic 510; a set of internal clock sources, such as internal clock source 520; a set of clock control circuits, such as clock control circuits 530, 532, 534 and 536 and a decoder 540. In other embodiments, decoder 540 does not exist. For ease of illustration, a limited number of clock sources, clock control circuits and external clock sources are shown. Additionally, only example connections between external clock sources, clock control circuits and internal clock sources are shown.

A clock control circuit is coupled to the clock path for each of the internal clock sources. For example, clock control circuit 530 is coupled to the clock path for internal clock source 520. The coupling is such that during scan testing the output from the clock control circuit is used to transmit a clock signal onto the clock path of the internal clock source that it is coupled to. During regular operation, the internal clock source transmits a clock signal onto the clock path of the internal clock source. The clock control circuits can be circuits such as those discussed with reference to FIGS. 3, 4A, 4B or 4C.

External clock sources 552, 554, 556, 558 and 560 provide clock signals for use during scan testing that can provide clock source 330 in FIGS. 3, 4A, 4B, and 4C. Each external clock source represents a different frequency clock. These external clock sources would be coupled to clock control circuits corresponding to internal clock sources in which the external and internal clock sources have the same frequency. Every internal clock path would be coupled to an external clock source. Additionally, each output of decoder 540 would be coupled to clock control circuits corresponding to internal clock sources that are within the same independent clock domain.

Figure 6:
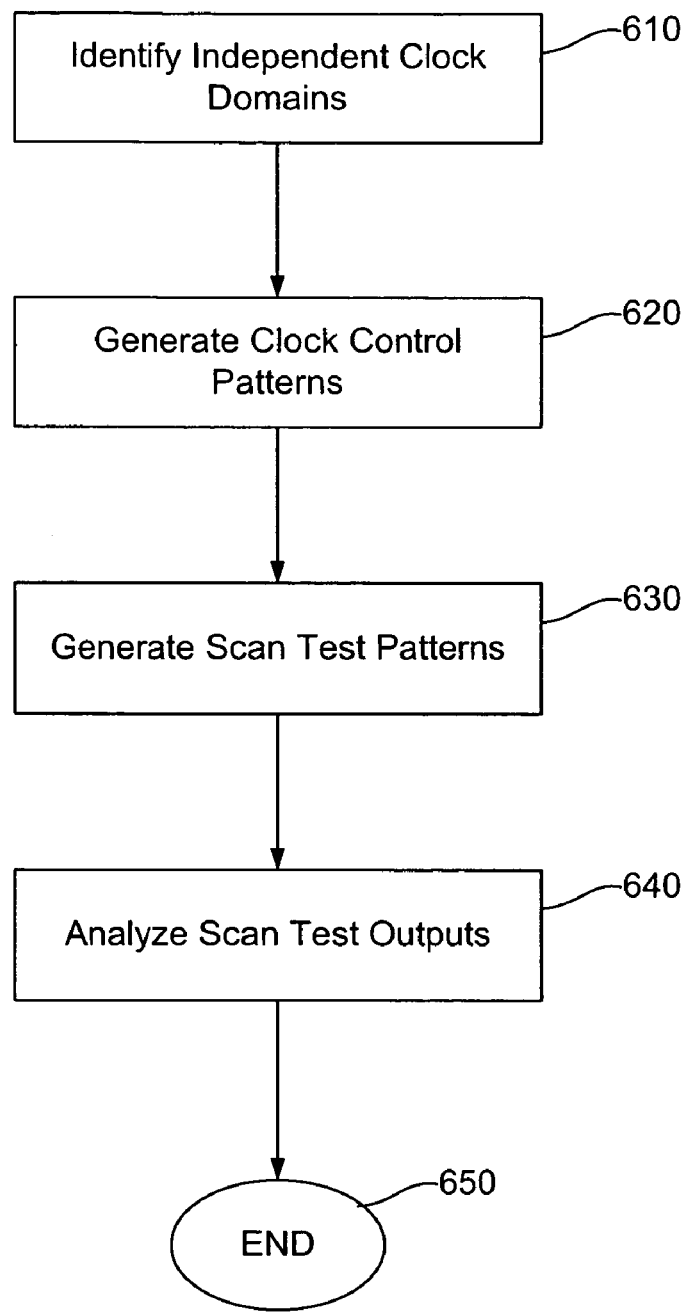
FIG. 6. is a flow chart of a method for conducting scan testing of an integrated circuit while using clock control circuits, according to an embodiment of the invention.

FIG. 6 is a flowchart of a method 600 for conducting scan testing on integrated circuit, according to an embodiment of the present invention. Method 600 can be used with an integrated circuit, such as, for example, integrated circuit 500. Method 600 begins in step 610. In step 610 independent clock domains are identified. An example method for identifying independent clock domains is disclosed in commonly owned, co-pending U.S. patent application Ser. No. 10/299,257, entitled "System and Method for Clock Domain Group Using Data Path Relationships," filed Nov. 19, 2002 by A. Guettaf.

In step 620 clock control test patterns are generated. These test patterns include a series of ones and zeroes that can be transmitted to flip-flops, such as, for example flip-flop 426 or 448, to provide a clock decision input that will instruct a clock control circuit to transmit an external clock source signal for scan testing. For example, referring to FIG. 4 the clock control test patterns could generate a signal to be transmitted on clock decision input 428.

In step 630 scan test patterns are generated. These test patterns are provided to an integrated circuit that is undergoing scan testing. The clock control patterns and scan test patterns are provided to the integrated circuited under test in such a way as to transmit the external clock source during capture mode as required by testing. Individuals skilled in the relevant arts will be able to integrate the clock control patterns and scan test patterns in such a way to produce the desired testing input, based on the teachings herein.

In step 640 scan test outputs from the integrated circuit under test are analyzed. These scan test outputs are generated by the integrated circuit under test, based on the scan test patterns and clock control patterns that were input. In step 650, method 600 ends.

In an alternative embodiment, quasi-independent clock domains can be generated in step 620. The quasi-independent clock domains are such that there is only a minimal relationship between clock paths within the quasi-independent domains. For example, two clock paths within a quasi-independent clock domain may have only a few shared elements, such as flip-flops, that they both impact. During testing, unpredictable results may result for these shared elements. To address this, the shared elements can be masked, such that they will not be considered errors when analyzing the scan test outputs in step 640.

Figure 7:
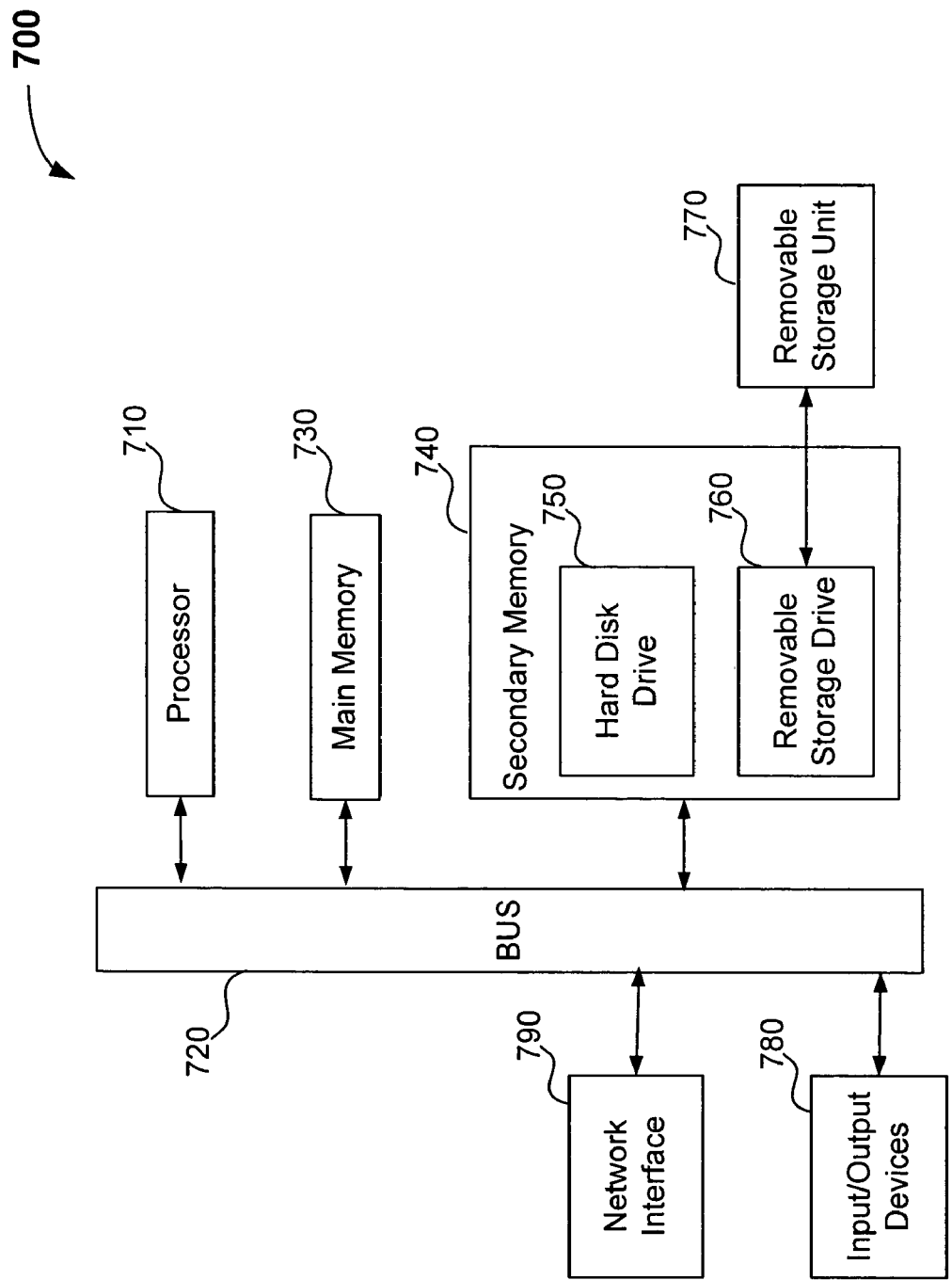
FIG. 7 is a diagram of a computer.

The methods of the invention or portions thereof are optionally implemented using well known computers, such as a computer 700 shown in FIG. 7, including but not limited to computers used to implement ATPG test tools and software. In particular, method 600 can be implemented within ATPG test software.

The computer 700 can be any commercially available and well known computer capable of performing the functions described herein, such as computers available from International Business Machines, Apple, Silicon Graphics Inc., Sun, HP, Dell, Cray, etc.

Computer 700 includes one or more processors (also called central processing units, or CPUs), such as processor 710. Processor 710 is connected to communication bus 720. Computer 700 also includes a main or primary memory 730, preferably random access memory (RAM). Primary memory 730 has stored therein control logic (computer software), and data.

Computer 700 may also include one or more secondary storage devices 740. Secondary storage devices 740 include, for example, hard disk drive 750 and/or removable storage device or drive 760. Removable storage drive 760 represents a floppy disk drive, a magnetic tape drive, a compact disk drive, an optical storage device, tape backup, ZIP drive, JAZZ drive, etc.

Removable storage drive 760 interacts with removable storage unit 770. As will be appreciated, removable storage unit 760 includes a computer usable or readable storage medium having stored therein computer software (control logic) and/or data. Removable storage drive 760 reads from and/or writes to the removable storage unit 770 in a well known manner.

Removable storage unit 770, also called a program storage device or a computer program product, represents a floppy disk, magnetic tape, compact disk, optical storage disk, ZIP disk, JAZZ disk/tape, or any other computer data storage device. Program storage devices or computer program products also include any device in which computer programs can be stored, such as hard drives, ROM or memory cards, etc.

In an embodiment, the present invention is directed to computer program products or program storage devices having software that enables computer 700, or multiple computer 700s to perform any combination of the functions described herein.

Computer programs (also called computer control logic) are stored in main memory 730 and/or the secondary storage devices 740. Such computer programs, when executed, direct computer 700 to perform the functions of the present invention as discussed herein. In particular, the computer programs, when executed, enable processor 710 to perform the functions of the present invention. Accordingly, such computer programs represent controllers of the computer 700.

Computer 700 also includes input/output/display devices 480, such as monitors, keyboards, pointing devices, etc.

Computer 700 further includes a communication or network interface 790. Network interface 790 enables computer 700 to communicate with remote devices. For example, network interface 790 allows computer 700 to communicate over communication networks, such as LANs, WANs, the Internet, etc. Network interface 790 may interface with remote sites or networks via wired or wireless connections. Computer 700 receives data and/or computer programs via network interface 790. The electrical/magnetic signals having contained therein data and/or computer programs received or transmitted by the computer 700 via interface 790 also represent computer program product(s).

The invention can work with software, hardware, and operating system implementations other than those described herein. Any software, hardware, and operating system implementations suitable for performing the functions described herein can be used.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A clock control circuit, comprising:
   a scan test clock control module that permits a clock signal to be transmitted;
   a scan test clock decision module coupled to said scan test clock control module that determines whether a clock signal is permitted to be transmitted;
   an OR gate, wherein the output of the OR is coupled to the scan test clock control module; and
   a flip-flop, wherein the Q output of the flip-flop is coupled to an input of said OR gate and the D output of said flip-flop is coupled to the output of said scan test clock control module.

2. The clock control circuit of claim 1, wherein said scan test clock control module comprises an AND gate.

3. A clock control circuit, comprising:
   a scan test clock control module that permits a clock signal to be transmitted;
   a scan test clock decision module coupled to said scan test clock control module that determines whether a clock signal is permitted to be transmitted;
   an OR gate, wherein the output of the OR is coupled to the scan test clock control module;
   a multiplexer, wherein the output of said multiplexer is coupled to an input of said OR gate;
   a flip-flop, wherein the Q output of the flip-flop is coupled to an input of said multiplexer and the D output of said flip-flop is coupled to the output of said scan test clock control module.

4. The clock control circuit of claim 3, wherein said multiplexer is coupled to a decoder that determines whether a clock signal should be permitted to be transmitted in capture mode.

5. In scan testing of an integrated circuit with a plurality of scan paths, a method for conducting scan testing of the integrated circuit, comprising:
   (a) identifying independent clock domains and quasi-independent clock domains, wherein shared elements within clock paths contained in a quasi-independent clock domain are masked;
   (b) generating clock control test patterns based on the independent clock domains for controlling clock signals transmitted through the integrated circuits;
   (c) generating scan test patterns; and
   (d) analyzing scan test output patterns.

6. The method of claim 5, further comprising:
   transmitting scan test patterns and clock control patterns to the integrated circuit.

7. The method of claim 5, wherein the clock control test patterns are based on the independent clock domains for controlling clock signals transmitted through the integrated circuits.

8. The method of claim 5, wherein the clock control test patterns are based on quasi-independent clock domains for controlling clock signals transmitted through the integrated circuits.

9. The method of claim 5, wherein the scan test output patterns are generated by the integrated circuit under test, based on the scan test patterns and clock control patterns.

10. A computer program product comprising a computer readable medium having computer program logic recorded thereon for enabling a processor to conduct scan testing of an integrated circuit comprising:
    a first function that enables the processor to identify independent clock domains;
    a second function that enables the processor to generate clock control test patterns based on the independent clock domains for controlling clock signals transmitted through the integrated circuit;
    a third function that enables the processor to generate scan test patterns;
    a fourth function that enables the processor to analyze scan test output patterns,
    a fifth function that enables the processor to identify quasi-independent clock domains; and
    a sixth function that enables the processor to mask shared elements within clock paths contained in a quasi-independent clock domain.

11. The computer program product of claim 10, further comprising a seventh function that enables the processor to transmit scan test patterns and clock control patterns to the integrated circuit.

12. The computer program code of claim 11, wherein the clock control test patterns are based on the independent clock domains for controlling clock signals transmitted through the integrated circuits.

13. The computer program code of claim 11, wherein the clock control test patterns are based on quasi-independent clock domains for controlling clock signals transmitted through the integrated circuits.

14. The computer program code of claim 11, wherein the scan test output patterns are generated by the integrated circuit under test, based on the scan test patterns and clock control patterns.

* * * * *